(12) United States Patent
Rudiak et al.

(10) Patent No.: US 11,821,936 B2
(45) Date of Patent: Nov. 21, 2023

(54) IN SITU THRESHOLD VOLTAGE DETERMINATION OF A SEMICONDUCTOR DEVICE

(71) Applicant: NXP USA, Inc., Austin, TX (US)

(72) Inventors: Jerry Rudiak, Phoenix, AZ (US); Ibrahim Shihadeh Kandah, Novi, MI (US)

(73) Assignee: NXP USA, Inc., Austin, TX (US)

( * ) Notice: Subject to any disclaimer, the term of this patent is extended or adjusted under 35 U.S.C. 154(b) by 220 days.

(21) Appl. No.: 17/571,699

(22) Filed: Jan. 10, 2022

(65) Prior Publication Data

US 2023/0221363 A1    Jul. 13, 2023

(51) Int. Cl.
| | |
|---|---|
| *G01R 31/26* | (2020.01) |
| *G01R 19/165* | (2006.01) |
| *H02M 7/5387* | (2007.01) |
| *H03K 17/567* | (2006.01) |
| *H03K 17/687* | (2006.01) |

(52) U.S. Cl.
CPC ... *G01R 31/2642* (2013.01); *G01R 19/16538* (2013.01); *H02M 7/5387* (2013.01); *H03K 17/567* (2013.01); *H03K 17/687* (2013.01)

(58) Field of Classification Search
CPC .... G01R 31/00; G01R 31/26; G01R 31/2607; G01R 31/2642; G01R 19/00; G01R 19/165; G01R 19/16533; G01R 19/16538; H02M 7/00; H02M 7/42; H02M 7/44; H02M 7/48; H02M 7/53; H03K 17/00; H03K 17/51; H03K 17/56; H03K 17/567; H03K 17/687

USPC .......... 324/500, 537, 750.01, 750.03, 762.01
See application file for complete search history.

(56) References Cited

U.S. PATENT DOCUMENTS

| | | |
|---|---|---|
| 5,838,164 A | 11/1998 | Chen |
| 5,938,164 A | 8/1999 | Kargol et al. |
| (Continued) | | |

FOREIGN PATENT DOCUMENTS

| | | | | |
|---|---|---|---|---|
| EP | 3109649 B1 | 8/2019 | | |
| EP | 3548882 B1 * | 9/2023 | ......... | G01N 27/4141 |
| (Continued) | | | | |

OTHER PUBLICATIONS

Bahun et al., "Real-Time Measurement of IGBT's Operating Temperature," Online ISSN 1848-3380, Print ISSN 0005-1144 ATKAFF 52(4), 2011, Published online: Jan. 18, 2017, pp. 295-305.

*Primary Examiner* — Hoai-An D. Nguyen

(57) ABSTRACT

A method for in situ threshold voltage determination of a semiconductor device includes sourcing a current to a first terminal of the semiconductor device. A gate terminal of the semiconductor device is driven with a plurality of gate levels. Each gate level includes one of a plurality of different gate voltages. A transistor voltage is measured between the first terminal and a second terminal of the semiconductor device during each gate level. The respective gate voltage is stored in response to the semiconductor device voltage transitioning past a voltage limit. A temperature dependent threshold voltage of the semiconductor device is estimated for a first measured temperature measured during the storing of the stored gate voltage from a previously stored gate voltage and a second measure temperature.

20 Claims, 8 Drawing Sheets

(56) References Cited

U.S. PATENT DOCUMENTS

| | | | |
|---|---|---|---|
| 7,211,867 B2 * | 5/2007 | Hayashi | H10B 12/01 |
| | | | 257/908 |
| 8,779,794 B2 | 7/2014 | Bernoux et al. | |
| 8,912,990 B2 * | 12/2014 | Vieri | G09G 3/3648 |
| | | | 345/87 |
| 10,261,122 B2 | 4/2019 | Sjoroos et al. | |
| 10,288,672 B2 | 5/2019 | Qiao et al. | |
| 2018/0102773 A1 | 4/2018 | Li et al. | |
| 2020/0343715 A1 | 10/2020 | Kaeriyama | |
| 2020/0400738 A1 | 12/2020 | Akin et al. | |

FOREIGN PATENT DOCUMENTS

| | | | |
|---|---|---|---|
| JP | 3885563 B2 * | 2/2007 | H02M 1/00 |
| KR | 100547040 B1 * | 1/2006 | H01L 22/14 |

\* cited by examiner

US 11,821,936 B2

IN SITU THRESHOLD VOLTAGE DETERMINATION OF A SEMICONDUCTOR DEVICE

FIELD

This disclosure relates generally to semiconductor devices, and more specifically to methods for in situ determination of a threshold voltage of a semiconductor device.

BACKGROUND

Incipient Fault Detection or early warning of a power device's degradation of performance due to aging or other system stress continues to be a topic of interest in systems where reliability and safety is a concern. The ability to interrogate a power device and monitor its health over the lifetime of the product is a powerful feature allowing system designers to anticipate failures and alert users to the need for service, prior to a catastrophic failure event.

One device parameter associated with an incipient fault is a threshold voltage of a transistor. As power devices age, the threshold of the device will shift. The ability to precisely measure the power device threshold voltage initially and over time can provide an early indication of a power device's end of life, or that the power device no longer meets the original design specification. Traditional methods to detect changes across terminals defining the collector and emitter, or the drain and source when the power device is in an "ON" state have been used. However, such methods may be intrusive and suffer from inaccuracies.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
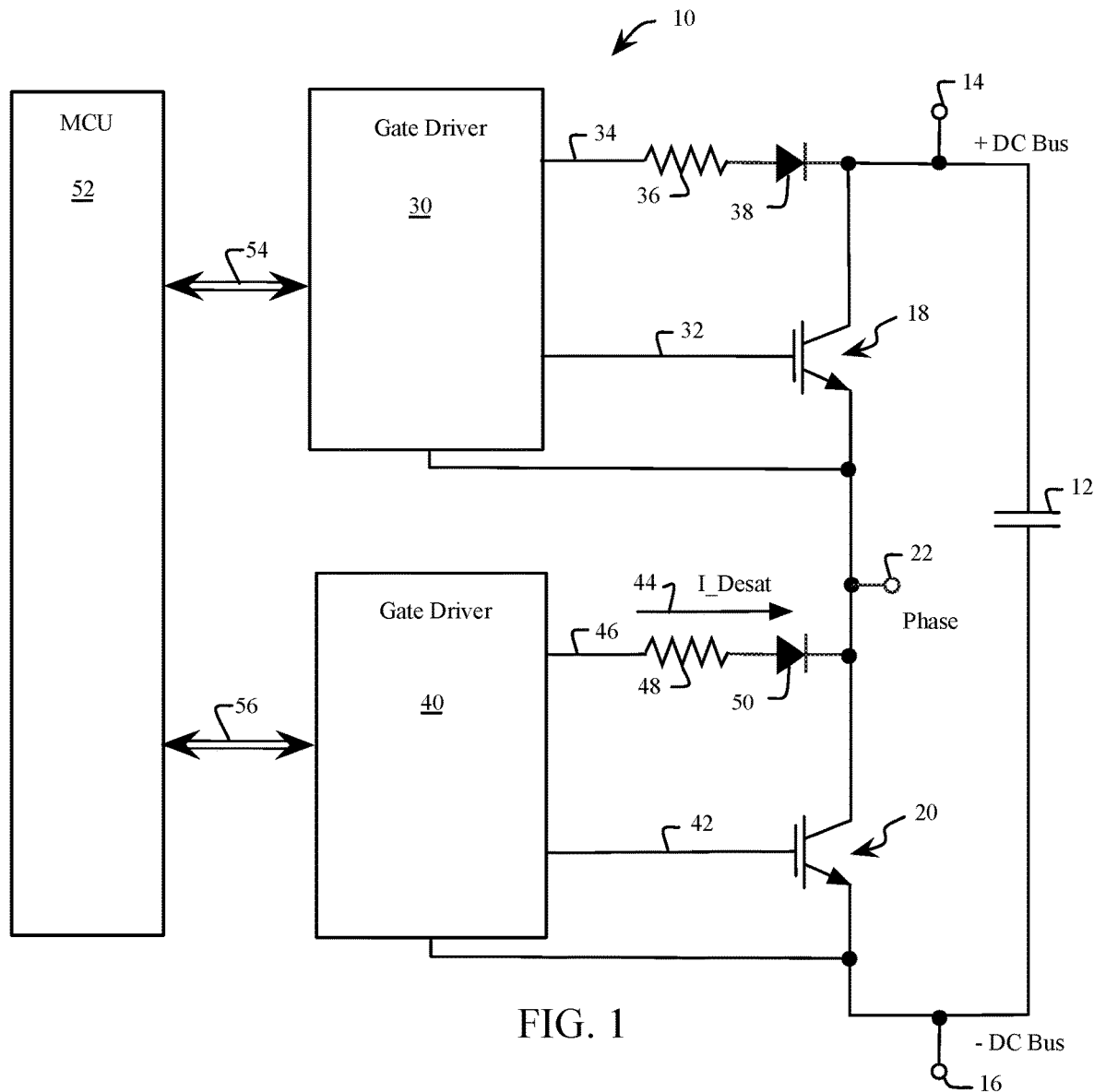
FIG. 1 is a schematic view of a half bridge inverter system employing in situ threshold voltage determination, in accordance with example embodiments of the present disclosure.

Embodiments described herein provide for methods for in situ determination of a threshold voltage of a device. In some embodiments, the threshold voltage is compared against previously stored threshold voltage values to determine a threshold voltage shift. In some embodiments, the determination of the threshold voltage shift is further used to detect an incipient fault condition of the device and furthermore a fault condition of a system within which the device operates. A fault condition may be determined based on a voltage shift exceeding a predetermined value, by a trend based on more than two values and/or by a dependency of multiple stored values. Methods are described in the context of a device configured to variably conduct current in response to a voltage exceeding a threshold voltage, a transistor, and a half-bridge inverter, amongst other embodiments.

Each method includes the sourcing of a calibrated current to a first terminal (e.g. a drain or collector), which is put in a high impedance state by deactivating other devices connected thereto. In one example, a first device is configured in series with a second device, connected therebetween at a terminal (e.g., a source/drain or emitter/collector). The terminal may be charged while the first and second devices are in an "OFF" state, thereby creating a voltage across the first device. In one example, the terminal is charged by a calibrated current sourced from a gate driver. In another example, the terminal is charged by a residual voltage remaining on a DC bus capacitor connected across the combination of the series connected first and second transistors. An "OFF" state is detected by measuring a voltage (e.g., an open circuit bridge voltage) across the first device. In one embodiment, a series of gate levels (e.g., applied as a step function or with a series of corresponding gate pulses), are subsequently applied to a gate terminal of the device or transistor with a sequentially increasing gate voltage until the gate voltage exceeds the threshold voltage as detected by a change (e.g., a collapse) of a voltage of the first terminal. In another embodiment, the series of gate levels sequentially decreases and the last gate level exceeding the threshold voltage is stored.

In various embodiments, the gate terminal is insulated, for example with an Insulated Gate Field Effect Transistor (IGFET) or an Insulated Gate Bipolar Transistor (IGBT), so that the current conducted through the device or transistor (e.g. drain to source, or collector to emitter) is primarily a function of the calibrated current applied to the first terminal. For example, activation of an IGFET with a known drain to source (Ids) current, and compensation for other parameters (e.g., IGFET temperature), which the threshold voltage depends upon, enables the determination of the threshold voltage based on an applied gate to source (Vgs) voltage from the series of applied gate pulses. In some embodiments, the device, transistor (e.g. IGET or IGBT) temperature may be determined by a coolant temperature of a heat sink, by the ambient temperature or by device temperature (e.g., by an integrated diode) near the device. Accordingly, the low power in situ method enables a precise determination of the threshold voltage, and in some embodiments a determination of the age of the IGFET and furthermore an indication of an incipient fault therein.

FIG. 1 shows a schematic view of an embodiment 10 of a half bridge inverter system. The embodiment 10 includes a capacitor 12 as a DC Link decoupling supply or filtering element from the drain or collector of the high-side transistor 18, to the source or emitter of the low-side transistor 20 and may be charged to a DC BUS voltage (e.g., the voltage between the upper supply 14 and the lower supply 16). In one embodiment, the upper supply is a Direct Current (DC) bus, having a voltage greater than a voltage of the lower supply 16. The capacitive load 12 may be charged or discharged with a cascode arrangement of a high-side transistor 18 connected in series with a low-side transistor 20. In an embodiment of a half bridge inverter, the high-side transistor 18 is connected to the low-side transistor 20 at a phase node 22.

The high-side transistor 18 is driven by a gate driver 30, which generates gate control signals on node 32. The gate driver 30 also is capable of generating a calibrated current, (not shown), on a node 34, which may be connected to a resistor 36 in series with an anode of a voltage blocking diode 38. A cathode of the diode 38 connects to the source/drain of the high-side transistor (e.g., a power device) 18. Similarly, the low-side transistor 20 is driven by a gate driver 40, which generates gate control signals on node 42. The gate driver 30 also generates a calibrated current (e.g., a desaturation current) 44 on a node 46, which further connects to a resistor 48 in series with an anode of a diode 50. A cathode of the diode 50 connects to the drain or collector of the low-side device 20. In one embodiment, the resistors 36 and 48 are removed.

In one embodiment, the diodes 38 and 50 protect the low voltage circuitry of the gate driver or similar IC from the high potentials seen at the Drain/Collector of the power devices when they are off. In one embodiment, the calibrated currents sourced from the respective gate drivers 30 and 40 are chosen to minimize the effect of parasitic leakage currents and to shorten the time required to determine the threshold voltages of the respective high-side transistor 18 and/or low-side transistor 20. In one embodiment, the threshold voltage of the high-side transistor 18 is determined, while the low-side transistor 20 remains in an off state. In another embodiment, the threshold voltage of the low-side transistor 20 is determined, while the high-side transistor 18 remains in an off state. In another embodiment, the threshold voltages of both the high-side transistor 18 and the low-side transistor 20 are determined individually. Advantageously, the methods described herein for measuring gate voltages with a calibrated current rely upon one of the two transistors 18 and 20 to be in the off state, thus also ensuring the half-bridge is in a "safely-off" condition.

In one example, the gate driver 30 produces a voltage (GND or negative) with respect to source or emitter of the high-side transistor 18 sufficient to deactivate the high-side transistor 18. The gate driver 40 supplies a calibrated current 44 to the collector or drain of the low-side transistor 20, at the phase node 22, which causes the voltage across the low-side transistor 20 to rise. As the high-side transistor 18 and the low-side transistor 20 remain in a high-impedance state while both transistors 18 and 20 are deactivated, this voltage at node 22 will be maintained as long as the current 44 continues to be sourced. In one embodiment, the gate driver 40 provides voltage pulses to the node 42 with sequentially increasing voltage until the low-side transistor 20 activates. In another embodiment, the gate driver 40 provides a series of increasing voltage levels as a step function. Activation of the low-side transistor 20 may be determined by monitoring the collector to emitter, or drain to source voltage of the low-side transistor 20 at the phase node 22 with a comparator circuit of the gate driver 40. The minimum pulsed voltage required to activate the low-side transistor 20 (e.g. Vgs) for a given Ids current (e.g., the calibrated current 44), provides a measure of the threshold voltage of the low-side transistor 20, which may be used in conjunction with a measured temperature so that future measurements can be normalized and/or compared with similar temperatures.

Each gate driver 30 and 40 communicates with a Micro Control Unit (MCU) 52 or similar computing device, over a respective communication bus 54 and 56. In one embodiment, the MCU 52 operates in lower voltage domain than the remaining circuitry of the embodiment 10. In one example, the determined minimum pulsed voltage required to active the low-side transistor 20 is communicated to the MCU 52, and may or may not be normalized by the gate driver with respect to a measured temperature to determine the threshold voltage of the low-side transistor 20, (or the high-side transistor 18 in another embodiment). In other embodiments, the MCU will take the raw voltage threshold measurements from the gate driver and will normalize with respect to system level temperature, or device level temperature. In various embodiments, the measured temperature is one of a system level temperature, an ambient temperature, a coolant temperature of a heat sinking device thermally coupled to the embodiment 10 or device temperature (e.g., measured with an integrated diode of an integrated circuit comprising either the low-side transistor 20 or high-side transistor 18). Subsequent to normalizing the determined threshold voltage of the power device being measured, in this case the low-side transistor 20, by the MCU 52, the normalized threshold voltage is stored by the MCU 52 in a memory device. In some embodiments, the measured temperature and the measured minimum pulsed voltage or stepped voltage are both stored in the memory device.

In another embodiment, the normalized threshold voltage of the low-side transistor 20 is determined repeatedly over time. The MCU 52 then compares two or more stored and normalized threshold voltages to a present or recent determination of the threshold voltage to determine a threshold voltage change. A change in the threshold voltage exceeding a voltage limit may indicate that the transistor being measured has aged beyond an acceptable design or reliability limit. In one example, the MCU 52 may then further respond to the indication of aging by notifying a system user of the embodiment 10, or deactivating circuitry including or related to the aged component.

Figure 2:
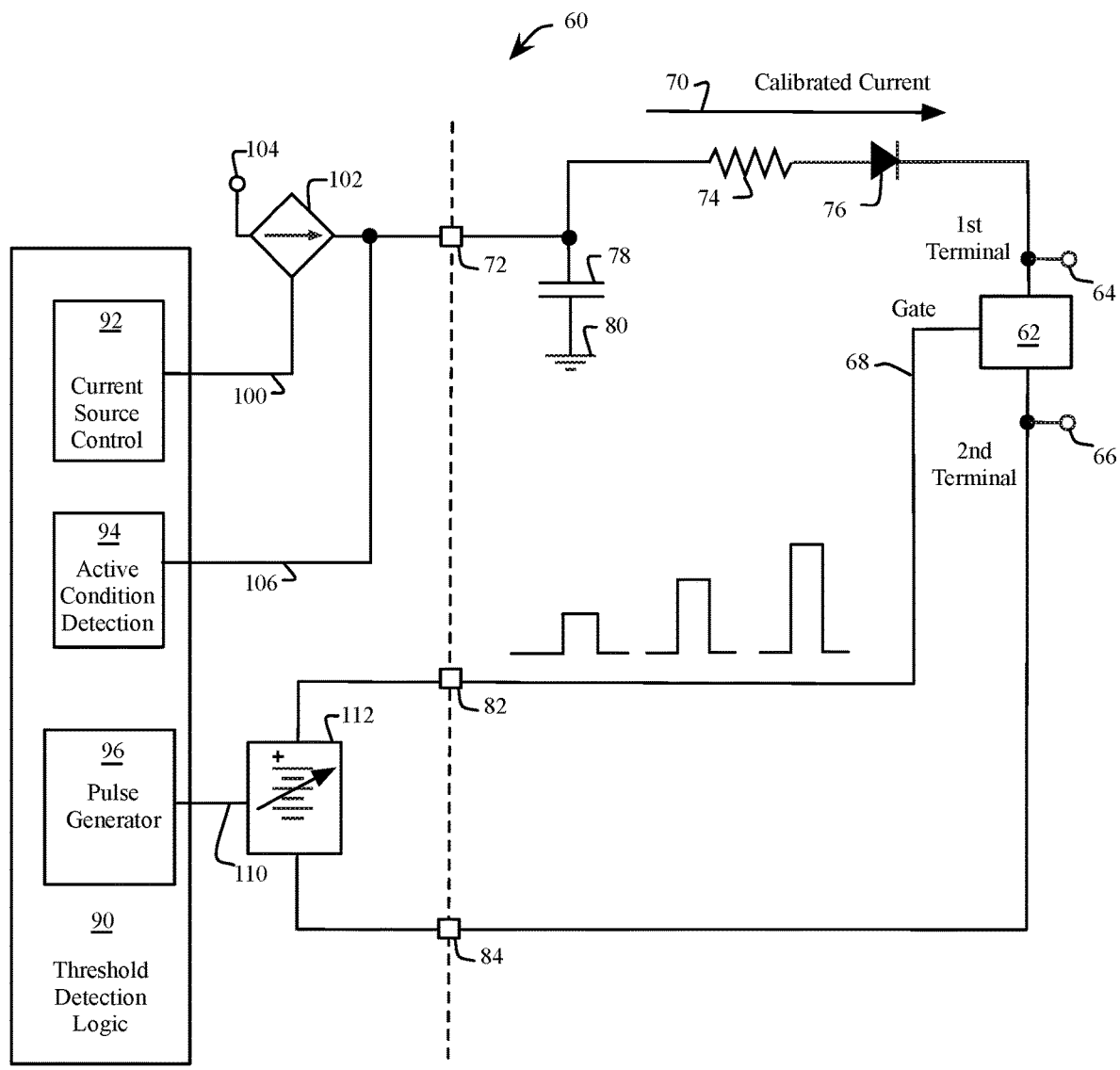
FIG. 2 is a schematic view of a circuit for in situ threshold voltage determination, in accordance with example embodiments of the present disclosure.

FIG. 2, with continued reference to FIG. 1, shows a schematic view of an embodiment 60 of a circuit for in situ determination of a threshold voltage of a device 62. In some embodiments, the device 62 is an IGBT, a Silicon Carbide IGFET, a Gallium Nitride IGFET, a Gallium Arsenide MOSFET or any transistor having an insulated gate terminal wherein the device variably conducts a current in response to a gate voltage exceeding a threshold voltage of the device. In the embodiment 60, the device 62 is configured to conduct current between a first terminal 64 and a second terminal 66, in response to a gate voltage in excess of a threshold voltage of the device 62 being applied to a gate terminal 68.

A calibrated current 70 is sourced from a terminal 72, through a resistor 74 connected in series with a diode 76. A cathode of the diode 76 connects to the first terminal 64. In one embodiment, the terminal 72 further connects to a charging capacitor 78 connected to a ground 80. In an embodiment, the calibrated current 70 biases the first terminal 64 to a voltage above a voltage limit, and the voltage on the gate terminal 68 is less than the threshold voltage of the device 62, thereby putting the device 62 in an "inactive" condition. In response to the gate terminal being biased above the threshold voltage of the device 62, the device 62 enters an "active" condition, and discharges the first terminal 64 to a level below the voltage limit. In one embodiment, the gate terminal of the device 62 is insulated so that minimal current conduction occurs between the gate terminal 68 and the second terminal 66. Accordingly, when the device 62 enters the active condition, the current flowing between the first terminal 64 and the second terminal 66 is the same as the calibrated current 70.

In the embodiment 60, the gate terminal 68 receives a series of pulses or voltage steps with sequentially increasing voltages at a terminal 82. The embodiment 60 further includes a threshold detection logic circuit 90. The threshold detection logic circuit 90 includes a current source control circuit 92, an active condition detection circuit 94 and a pulse generator circuit 96. In one embodiment, the current source control circuit 92 generates a control signal 100 to control a current source 102, to generate the calibrated current 70 from a voltage source 104. In one non-limiting embodiment, the voltage source 104 is connected to the upper supply 14 of FIG. 1. The active condition detection circuit 94 monitors a voltage on a node 106 to determine a voltage change on the first terminal 64. In one embodiment, the pulse generator circuit 96 generates a control signal 110, which controls a variable voltage source 112 to generate a series of pulses with sequentially increasing voltages on the terminal 82. In another embodiment, the pulse generator circuit 96 is replaced with a stepped function generator. In one embodiment, the circuitry included in the threshold detection logic circuit 90 the current source 102 and the variable voltage source 112 is included in the gate driver 30 or the gate driver 40 of FIG. 1.

Figure 3:
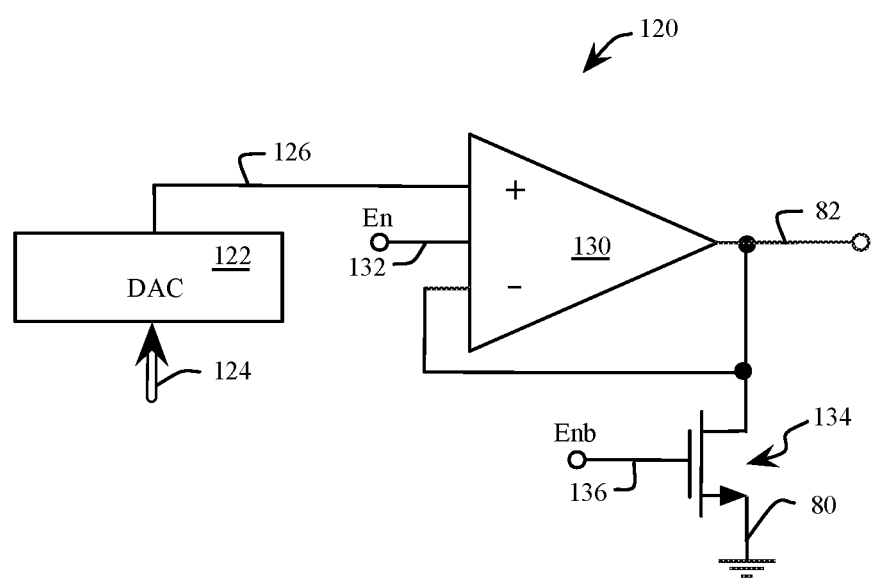
FIG. 3 is a schematic view of a gate pulse generator circuit, in accordance with example embodiments of the present disclosure.

FIG. 3, with continued reference to FIG. 2, shows a schematic view of an embodiment 120 of a variable voltage pulse generator circuit, performing a similar function to the pulse generator 96 and variable voltage source 112 of FIG. 2. The embodiment 120 includes a Digital to Analog Converter (DAC) (configured to receive a sequential series of digital values on an input bus 124 and to generate an equivalent analog value on a node 126. An amplifier 130 is arranged in a voltage follower configuration to provide the analog value from the node 126 on the terminal 82. In one embodiment, the amplifier 130 is enabled with an enable signal (En) on the node 132. By sequentially stepping through a series of digital values on the input bus 124, the terminal voltage 82 is sequentially increased. A pull-down transistor 134 is enabled with an inverted enable signal (Enb) on node 136. The signal Enb on node 136 is formed by inverting the signal on the node 132 and is active during state transitions on the digital input bus 124, thereby forming a series of voltage pulses on the terminal 82. In one embodiment, a duty cycle of the generated voltage pulses is minimized to provide protection against excessive current consumption in the event that the (opposing low-side or high-side transistor is shorted due to a fault) phase node 22 of FIG. 1, or the first terminal 64 of FIG. 2 is shorted to ground due to a fault. The duty cycle may be varied by adjusting an ON time, a frequency of the pulse, or both.

Figure 4:
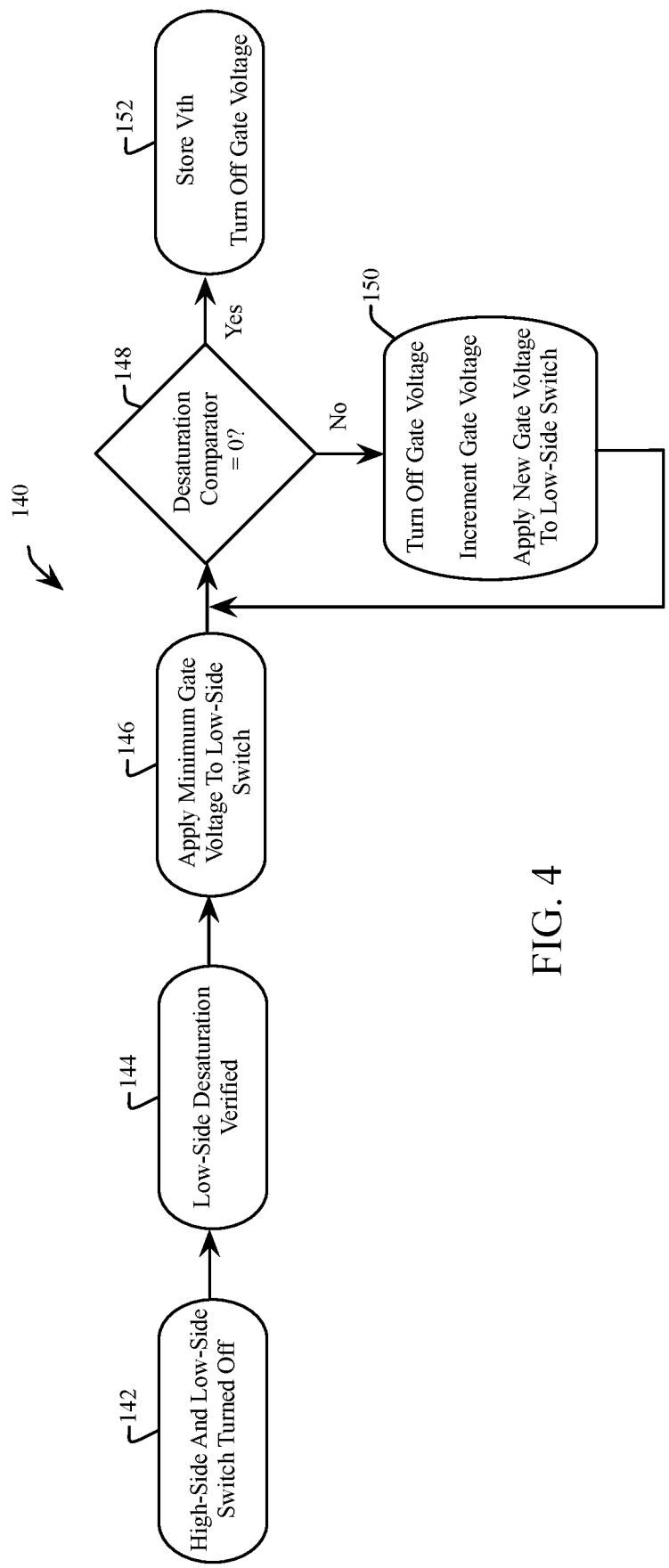
FIG. 4 is a flowchart representation of a method for in situ threshold voltage determination of a device, in accordance with an embodiment of the present disclosure.

FIG. 4 shows an embodiment 140 of a method for in situ threshold voltage determination of a device. With reference to FIG. 1 and FIG. 4, at 142 the high-side switch (e.g., a transistor) 18 and the low-side switch (e.g., a transistor) 20 are turned off. At 144, voltage detection circuit (e.g., a low-side desaturation verifier in one embodiment), verifies the voltage on the phase node 22 of FIG. 1 exceeding the voltage limit, and so thereby verifying that the high-side switch 18 is "OFF" At 146, a minimum gate voltage is applied to the low-side switch 20. The minimum gate voltage is determined by a value less than the minimum anticipated threshold voltage of the low-side transistor 20 taking into consideration process, voltage and temperature variations. At 148, the desaturation comparator or any generalized voltage comparator is checked for a zero condition. In another example, the active condition detection circuit 94 of FIG. 2 verifies that the node 106 has been discharged below the voltage limit to indicate that the low-side transistor 20 is "ON". If the condition at 148 is true, the applied voltage on the low-side switch 20 exceeds its threshold voltage and the applied voltage is then normalized with a temperature and the determined threshold voltage of the low-side switch 20 is stored. Otherwise, the gate voltage is turned off, incremented and reapplied at 150.

Figure 5:
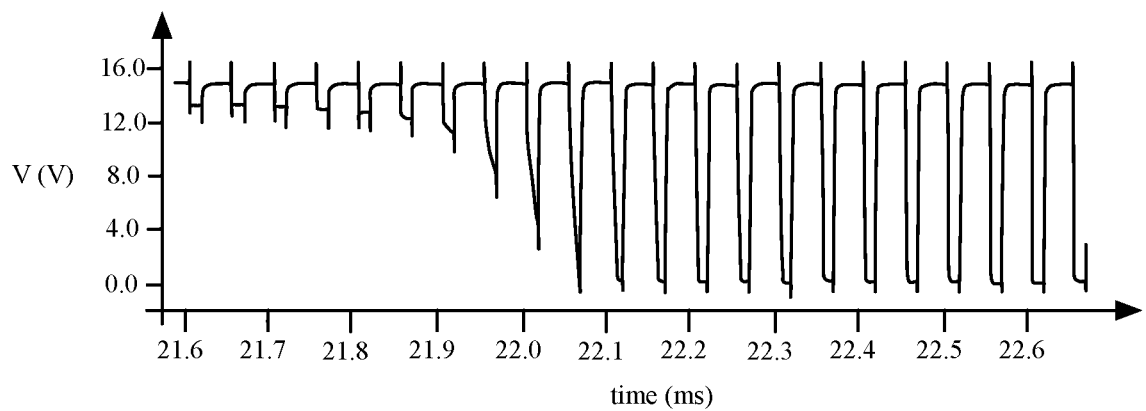
FIG. 5 is a graphical view of a phase node voltage of the embodiment of FIG. 1 during in situ threshold voltage determination, in accordance with an embodiment of the present disclosure.
Figure 6:
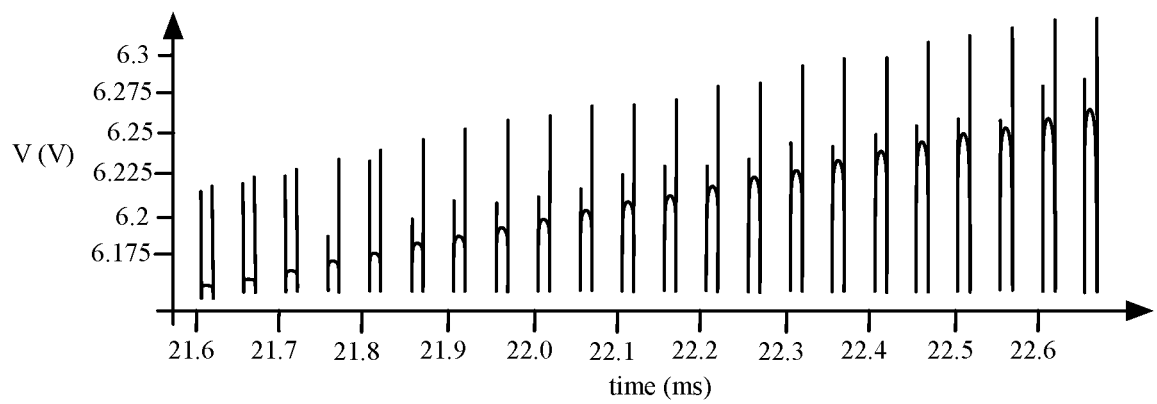
FIG. 6 is a graphical view of a gate pulse voltage of the embodiment of FIG. 1 during in situ threshold voltage determination, in accordance with an embodiment of the present disclosure.
Figure 7:
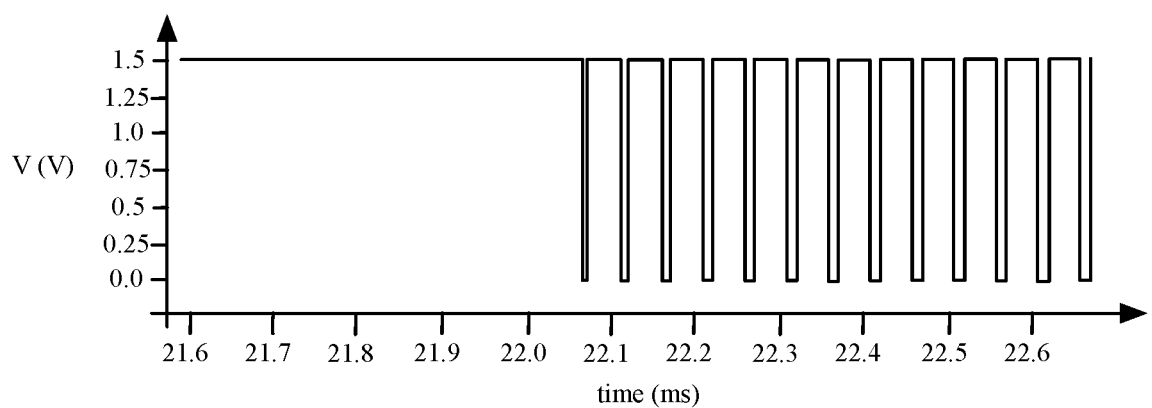
FIG. 7 is a graphical view of a comparator output detecting an active condition of the embodiment of FIG. 1 during in situ threshold voltage determination, in accordance with an embodiment of the present disclosure.

FIG. 5, FIG. 6 and FIG. 7 with reference to FIG. 1 shows the voltages, across the transistor being tested, the gate pulse voltage applied to node 42 and a comparator output (e.g., an output of the active condition detection circuit 94) respectively, in accordance with the embodiment 10. Specifically, in FIG. 5, the voltage on the phase node 22 varies due to parasitic coupling but does not drop below a voltage limit (indicating that the low-side transistor 20 has been activated), until after 22.0 ms. It should be understood that the time values shown in FIG. 5 through FIG. 7 are for illustration only. In other embodiments, other time values may occur with similar effect. Similarly, FIG. 6 shows sequentially increasing pulse voltages and FIG. 7 shows the comparator output of the active condition detection circuit 94 after 22.0 ms indicating an active state of the low-side transistor 20. In one embodiment, once the comparator initially transitions to a low state, the threshold voltage measurement can be stored and communicated, then the measurement sequence exited.

Figure 8:
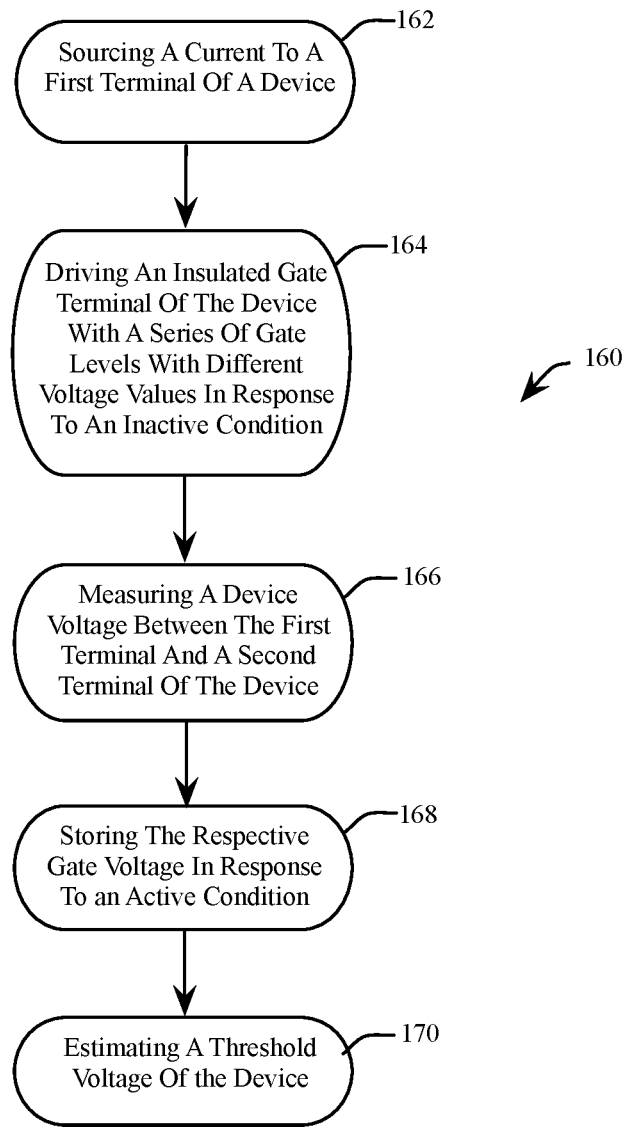
FIG. 8 is a flowchart representation of another method for in situ threshold voltage determination of a device, in accordance with an embodiment of the present disclosure.

FIG. 8 shows an example embodiment 160 of a method for in situ threshold voltage determination of a device. With reference to FIG. 8 and the embodiment 60 of FIG. 2, at 162 a current 70 is sourced to a first terminal 64 of a device 62. At 164, an insulated gate terminal 68 of the device 62 is driven with a series of gate levels with different voltage values in response to an inactive condition (e.g., a voltage level on node 106 transitioning past a voltage limit). At 166, a device voltage is measured between a first terminal 64 and a second terminal 66 of the device 62. At 168, the respective gate voltage is stored in response to an active condition, for example in a memory device in the MCU 52 of FIG. 1 or coupled thereto. At 170, a threshold voltage of the device 62 is estimated.

Figure 9:
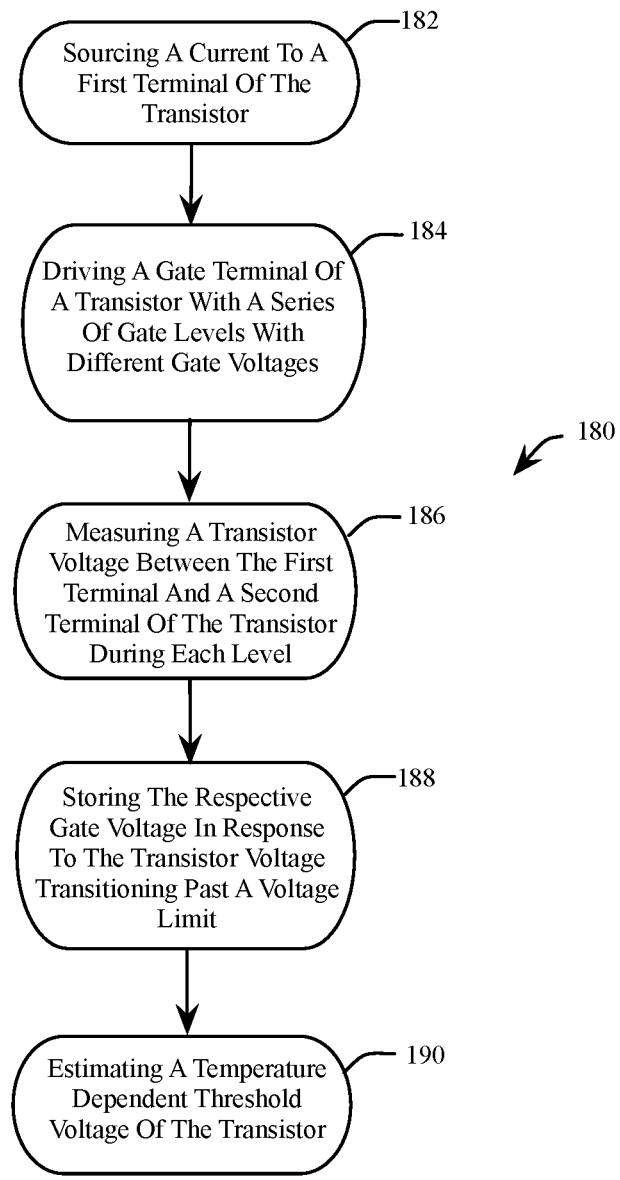
FIG. 9 is a flowchart representation of another method for in situ threshold voltage determination of a transistor, in accordance with an embodiment of the present disclosure.

FIG. 9 shows an example embodiment 180 of a method for in situ threshold voltage determination of a transistor. With reference to FIG. 9 and the embodiment 60 of FIG. 2, at 182 a current 70 is sourced to a first terminal 64 of a transistor 62. At 184, a gate terminal 68 of the transistor 62 is driven with a series of gate levels with different gate voltages. At 186, a transistor voltage is measured between a first terminal 64 and a second terminal 66 of the transistor 62 during each level. At 188, the respective gate voltage is stored in response to the transistor voltage transitioning past a voltage limit (e.g., as measured by the active condition detection circuit 94). At 190, a temperature dependent threshold voltage of the transistor 62 is estimated.

Figure 10:
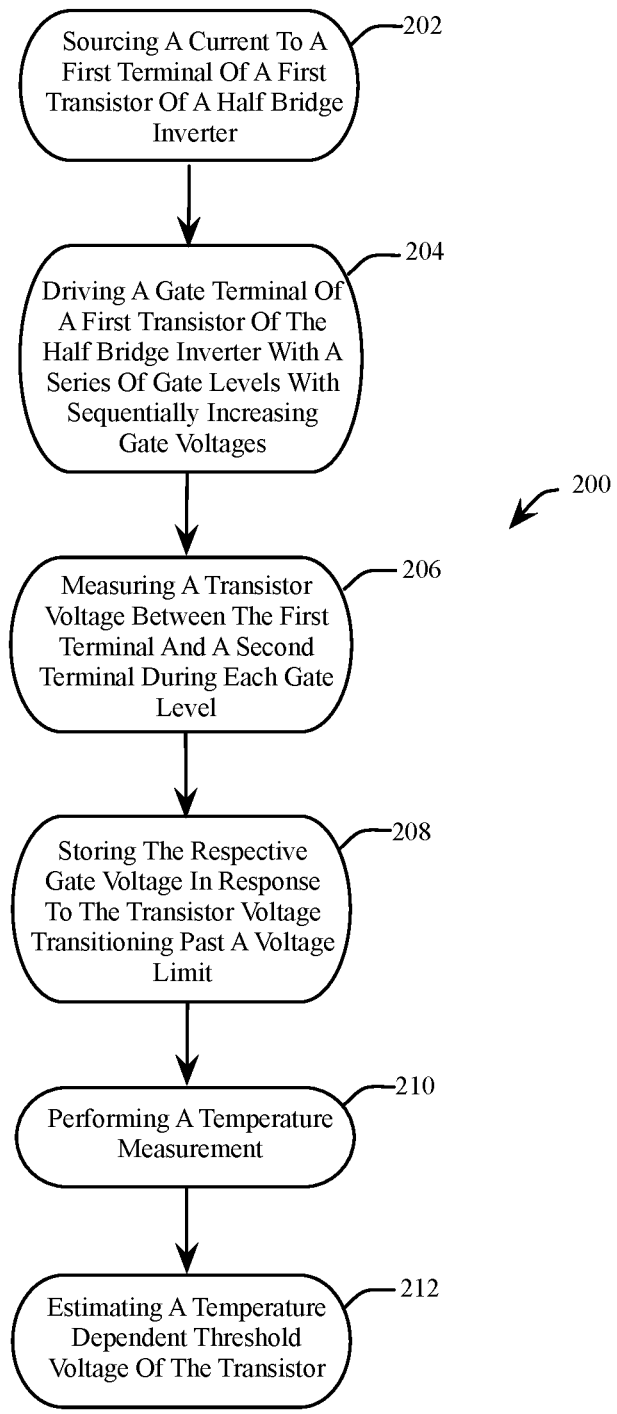
FIG. 10 is a flowchart representation of another method for in situ aging determination of a half bridge inverter, in accordance with an embodiment of the present disclosure.

FIG. 10 shows an example embodiment 200 of a method for in situ aging determination of a half bridge inverter. With reference to FIG. 10 and the embodiment 10 of FIG. 1, at 202 a current 44 (e.g., a desaturation current) is sourced to a first terminal of a transistor of a half bridge inverter 10. At 204, a gate terminal 42 of a first transistor 20 of the half bridge inverter 10 is driven with a series of gate levels with sequentially increasing gate voltages. At 206, a transistor voltage is measured between the first terminal 22 and a second terminal 16 of the half bridge inverter 10 during each gate level. At 208, the respective gate voltage is stored in response to the transistor voltage transitioning past a voltage limit (e.g., as measured by the active condition detection circuit 94 within the gate driver 40). At 210, a temperature measurement is performed (e.g., of an ambient temperature, a coolant temperature of a heat sink or a device temperature of the low-side transistor 20). At 212, a temperature dependent threshold voltage of the transistor 20 is estimated by correlating previous thresholds at the same temperature, or in another embodiment the threshold at temperature can be normalized to a previous data taken at different temperatures.

As will be appreciated, at least some of the embodiments as disclosed include at least the following. In one embodiment, a method for in situ threshold voltage determination of a device comprises sourcing a current to a first terminal of the device. An insulated gate terminal of the device is driven with a plurality of gate levels in response to a device voltage indicating an inactive condition of the device, wherein each gate level comprises a respective gate voltage being different than the respective gate voltage of a temporally adjacent and preceding gate level. The device voltage is measured between the first terminal and a second terminal of the device. The device is configured to variably conduct a device current thereinbetween in response to the respective gate voltage exceeding a threshold voltage of the device. The respective gate voltage is stored in response to the device voltage indicating an active condition of the device. A change in the threshold voltage of the device is estimated by comparing the stored gate voltage with a previously stored gate voltage.

Alternative embodiments of the method for in situ threshold voltage determination of a device include one of the following features, or any combination thereof. A temperature difference between a first measured temperature of the stored gate voltage and a second measured temperature of the previously stored gate voltage is less than a temperature threshold. The plurality of gate levels comprises a step function. The plurality of gate levels comprises gate pulses. A duty cycle of each of the plurality of gate pulses is limited. The respective gate voltage of each gate level increases from the respective gate voltage of the temporally adjacent and preceding gate level. The change in the threshold voltage is compared to a voltage limit to determine an incipient fault condition of the device. The first terminal is charged to a precharged voltage with the current and the inactive condition is determined in response to the device voltage exceeding a voltage limit.

In another embodiment, a method for in situ threshold voltage determination of a transistor comprises sourcing a current to a first terminal of the transistor. A gate terminal of the transistor is driven with a plurality of gate levels. Each gate level comprises one of a plurality of different gate voltages. A transistor voltage is measured between the first terminal and a second terminal of the transistor during each gate level. The respective gate voltage is stored in response to the transistor voltage transitioning past a voltage limit. A temperature dependent threshold voltage of the transistor is estimated for a first measured temperature measured during the storing of the stored gate voltage from a previously stored gate voltage and a second measured temperature.

Alternative embodiments of the method for in situ threshold voltage determination of a transistor include one of the following features, or any combination thereof. The transistor comprises an Insulated Gate Bipolar Transistor. The transistor comprises a Field Effect Transistor. The plurality of gate levels comprises a step function. Each of the plurality of gate levels comprises a gate pulse and the sequentially increasing gate voltage of each gate pulse is determined by incrementing an analog voltage with a Digital to Analog Converter to modulate an output of an amplifier, wherein the output generates each gate pulse. The transistor comprises a low-side transistor of a half-bridge inverter. The transistor comprises a high-side transistor of a half-bridge inverter.

In another embodiment, a method for in situ aging determination of a half bridge inverter comprises sourcing a current to a first terminal of a first transistor of the half bridge inverter. A gate terminal of the first transistor is driven with a plurality of gate levels. Each gate level comprises one of a plurality of sequentially increasing gate voltages. The half bridge inverter comprises the first transistor and a second transistor, wherein the first transistor connects between the first terminal and a second terminal, and a second transistor connects in series with the first transistor. A transistor voltage is measured between the first terminal and the second terminal during each gate level. The respective gate voltage is stored in response to the transistor voltage transitioning past a voltage limit. A temperature is measured to generate a temperature measurement. A temperature dependent threshold voltage of the first transistor is estimated for a first measured temperature measured during the storing of the stored gate voltage from a previously stored gate voltage and a second measured temperature.

Alternative embodiments of the method for in situ aging determination of a half bridge inverter include one of the following features, or any combination thereof. A change in the temperature dependent threshold voltage of the first transistor is estimated between the stored gate voltage and the previously stored gate voltage normalized for a difference between the first measured temperature and the second measured temperature and performing a system level action in response thereto. The current value of the current is calibrated to enable the estimation of the threshold voltage to nullify changes to the threshold voltage due to a time-dependent variation in the current. The temperature varies in proportion to a transistor temperature of the first transistor. The second transistor is turned off prior to driving the gate terminal of the first transistor with the plurality of gate levels.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for in situ threshold voltage determination of a device comprising:
    sourcing a current to a first terminal of the device;
    driving an insulated gate terminal of the device with a plurality of gate levels in response to a device voltage indicating an inactive condition of the device, wherein each gate level comprises a respective gate voltage being different than the respective gate voltage of a temporally adjacent and preceding gate level;
    measuring the device voltage between the first terminal and a second terminal of the device, the device configured to variably conduct a device current thereinbetween in response to the respective gate voltage exceeding a threshold voltage of the device;
    storing the respective gate voltage in response to the device voltage indicating an active condition of the device; and
    estimating a change in the threshold voltage of the device by comparing the stored gate voltage with a previously stored gate voltage.

2. The method of claim 1 wherein a temperature difference between a first measured temperature of the stored gate voltage and a second measured temperature of the previously stored gate voltage is less than a temperature threshold.

3. The method of claim 1 wherein the plurality of gate levels comprises a step function.

4. The method of claim 1 wherein the plurality of gate levels comprises gate pulses.

5. The method of claim 4 further comprising limiting a duty cycle of each of the plurality of gate pulses.

6. The method of claim 1 wherein the respective gate voltage of each gate level increases from the respective gate voltage of the temporally adjacent and preceding gate level.

7. The method of claim 1 further comprising comparing the change in the threshold voltage to a voltage limit to determine an incipient fault condition of the device.

8. The method of claim 1 further comprising charging the first terminal to a precharged voltage with the current and determining the inactive condition in response to the device voltage exceeding a voltage limit.

9. A method for in situ threshold voltage determination of a transistor comprising:
    sourcing a current to a first terminal of the transistor;
    driving a gate terminal of the transistor with a plurality of gate levels, each gate level comprising one of a plurality of different gate voltages;
    measuring a transistor voltage between the first terminal and a second terminal of the transistor during each gate level;
    storing the respective gate voltage in response to the transistor voltage transitioning past a voltage limit; and
    estimating a temperature dependent threshold voltage of the transistor for a first measured temperature measured during the storing of the stored gate voltage from a previously stored gate voltage and a second measured temperature.

10. The method of claim 9 wherein the transistor comprises an Insulated Gate Bipolar Transistor.

11. The method of claim 9 wherein the transistor comprises a Field Effect Transistor.

12. The method of claim 9 wherein the plurality of gate levels comprises a step function.

13. The method of claim 9 wherein each of the plurality of gate levels comprises a gate pulse and the sequentially increasing gate voltage of each gate pulse is determined by incrementing an analog voltage with a Digital to Analog Converter to modulate an output of an amplifier, wherein the output generates each gate pulse.

14. The method of claim 9 wherein the transistor comprises a low-side transistor of a half-bridge inverter.

15. The method of claim 9 wherein the transistor comprises a high-side transistor of a half-bridge inverter.

16. A method for in situ aging determination of a half bridge inverter comprising:
    sourcing a current to a first terminal of a first transistor of the half bridge inverter;
    driving a gate terminal of the first transistor with a plurality of gate levels, each gate level comprising one of a plurality of sequentially increasing gate voltages, the half bridge inventor comprising the first transistor and a second transistor, wherein the first transistor connects between the first terminal and a second terminal, and a second transistor connects in series with the first transistor;
    measuring a transistor voltage between the first terminal and the second terminal during each gate level;
    storing the respective gate voltage in response to the transistor voltage transitioning past a voltage limit;
    measuring a temperature to generate a temperature measurement; and
    estimating a temperature dependent threshold voltage of the first transistor for a first measured temperature measured during the storing of the stored gate voltage from a previously stored gate voltage and a second measured temperature.

17. The method of claim 16 further comprising estimating a change in the temperature dependent threshold voltage of the first transistor between the stored gate voltage and the previously stored gate voltage normalized for a difference between the first measured temperature and the second measured temperature and performing a system level action in response thereto.

18. The method of claim 16 wherein the current value of the current is calibrated to enable the estimation of the threshold voltage to nullify changes to the threshold voltage due to a time-dependent variation in the current.

19. The method of claim 16 wherein the temperature varies in proportion to a transistor temperature of the first transistor.

20. The method of claim 16 further comprising turning off the second transistor prior to driving the gate terminal of the first transistor with the plurality of gate levels.

* * * * *